(12) United States Patent
Billiet et al.

(10) Patent No.: US 12,517,430 B2
(45) Date of Patent: Jan. 6, 2026

(54) LITHOGRAPHIC PRINTING PLATE PRECURSOR

(71) Applicant: ECO3 BV, Mortsel (BE)

(72) Inventors: Thomas Billiet, Mortsel (BE); Kristof Heylen, Mortsel (BE)

(73) Assignee: ECO3 BV, Mortsel (BE)

( * ) Notice: Subject to any disclaimer, the term of this patent is extended or adjusted under 35 U.S.C. 154(b) by 109 days.

(21) Appl. No.: 18/042,827

(22) PCT Filed: Jul. 5, 2021

(86) PCT No.: PCT/EP2021/068438
§ 371 (c)(1),
(2) Date: Feb. 24, 2023

(87) PCT Pub. No.: WO2022/042912
PCT Pub. Date: Mar. 3, 2022

(65) Prior Publication Data
US 2023/0350291 A1   Nov. 2, 2023

(30) Foreign Application Priority Data

Aug. 31, 2020 (EP) ..................... 20193547

(51) Int. Cl.
*G03F 7/031* (2006.01)
*B41C 1/10* (2006.01)
*G03F 7/032* (2006.01)
*G03F 7/32* (2006.01)

(52) U.S. Cl.
CPC ............ *G03F 7/031* (2013.01); *B41C 1/1008* (2013.01); *G03F 7/032* (2013.01); *G03F 7/322* (2013.01); *B41C 2210/04* (2013.01); *B41C 2210/06* (2013.01)

(58) Field of Classification Search
None
See application file for complete search history.

(56) References Cited

U.S. PATENT DOCUMENTS

| 2005/0244746 A1 | 11/2005 | Makino et al. | |
| 2006/0194149 A1* | 8/2006 | Yamasaki | B41C 1/1016 430/270.1 |
| 2010/0242766 A1* | 9/2010 | Sonokawa | B41C 1/1008 101/463.1 |

FOREIGN PATENT DOCUMENTS

| EP | 0851299 A1 | 7/1998 | |
| EP | 1091251 A2 | 4/2001 | |
| EP | 1495866 A2 | 1/2005 | |
| EP | 1500498 A2 | 1/2005 | |
| EP | 1520694 A2 * | 4/2005 | ........... B41C 1/1008 |
| EP | 1695822 A2 | 8/2006 | |
| EP | 1844946 A1 | 10/2007 | |
| EP | 2105797 A1 | 9/2009 | |

OTHER PUBLICATIONS

European Patent Office, International Search Report in International Patent Application No. PCT/EP2021/068438, mailed Sep. 14, 2021, 4 pp.
European Patent Office, Written Opinion in International Patent Application No. PCT/EP2021/068438, mailed Sep. 14, 2021, 5 pp.

* cited by examiner

*Primary Examiner* — Chanceity N Robinson
(74) *Attorney, Agent, or Firm* — Leydig, Voit & Mayer, Ltd.

(57) ABSTRACT

A lithographic printing plate precursor is disclosed including a support and a coating comprising a photopolymerisable layer including a polymerisable compound and a photoinitiator, characterized in that the coating comprises a hydrophilic adhesion promoting copolymer including at least one monomeric unit according to Formula I and at least one monomeric unit according to Formula II; and at least one group and/or moiety including a phosphor atom.

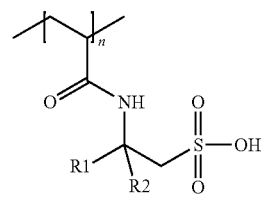

Formula I

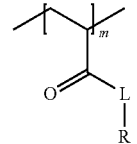

Formula II

19 Claims, No Drawings

LITHOGRAPHIC PRINTING PLATE PRECURSOR

CROSS-REFERENCE TO RELATED APPLICATIONS

This patent application is the U.S. national stage of copending International Patent Application No. PCT/EP2021/068438, filed Jul. 5, 2021, which claims the benefit of European Patent Application No. 20193547.5, filed Aug. 31, 2020.

TECHNICAL FIELD

The invention relates to a novel lithographic printing plate precursor.

BACKGROUND ART

Lithographic printing typically involves the use of a so-called printing master such as a printing plate which is mounted on a cylinder of a rotary printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Lithographic printing masters are generally obtained by the image-wise exposure and processing of a radiation sensitive layer on a lithographic support. Imaging and processing renders the so-called lithographic printing plate precursor into a printing plate or master. Image-wise exposure of the radiation sensitive coating to heat or light, typically by means of a digitally modulated exposure device such as a laser, triggers a physical and/or chemical process, such as ablation, polymerization, insolubilization by cross-linking of a polymer or by particle coagulation of a thermoplastic polymer latex, solubilization by the destruction of intermolecular interactions or by increasing the penetrability of a development barrier layer. Although some plate precursors are capable of producing a lithographic image immediately after exposure, the most popular lithographic plate precursors require wet processing since the exposure produces a difference in solubility or difference in rate of dissolution in a developer between the exposed and the non-exposed areas of the coating. In positive working lithographic plate precursors, the exposed areas of the coating dissolve in the developer while the non-exposed areas remain resistant to the developer. In negative working lithographic plate precursors, the non-exposed areas of the coating dissolve in the developer while the exposed areas remain resistant to the developer. Most lithographic plate precursors contain a hydrophobic coating on a hydrophilic support, so that the areas which remain resistant to the developer define the ink-accepting, hence printing areas of the plate while the hydrophilic support is revealed by the dissolution of the coating in the developer at the non-printing areas.

Photopolymer printing plates rely on a working-mechanism whereby the coating—which typically includes free radically polymerisable compounds—hardens upon exposure. "Hardens" means that the coating becomes insoluble or non-dispersible in the developing solution and may be achieved through polymerization and/or crosslinking of the photosensitive coating upon exposure to light and/or heat. Photopolymer plate precursors can be sensitized to blue, green or red light i.e. wavelengths ranging between 450 and 750 nm, to violet light i.e. wavelengths ranging between 300 and 450 nm or to infrared light i.e. wavelengths ranging between 750 and 1500 nm. Optionally, the exposure step is followed by a heating step to enhance or to speed-up the polymerization and/or crosslinking reaction.

In general, a toplayer or protective overcoat layer over the imageable layer is required to act as an oxygen barrier to provide the desired sensitivity to the plate. A protective overcoat layer typically includes water-soluble or water-swellable polymers such as for example polyvinylalcohol and/or copolymers thereof. Besides acting as barrier for oxygen, the protective overcoat layer should best be easily removable during processing and be sufficiently transparent for actinic radiation, e.g. from 300 to 450 nm or from 450 to 750 nm or from 750 to 1500 nm.

The classical workflow of photopolymer plates involves first an exposure step of the photopolymer printing plate precursor in a violet or infrared platesetter, followed by an optional pre-heat step, a wash step of the protective overcoat layer, an alkaline developing step, and a rinse and gum step. However, there is a clear evolution in the direction of a simplified workflow where the pre-heat step and/or wash step are eliminated and where the processing and gumming step are carried out in one single step or where processing is carried out with a neutral gum and then gummed in a second step. Alternatively, on-press processing wherein the plate is mounted on the press and the coating layer is developed by interaction with the fountain and/or ink that are supplied to the plate during the press run, has become very popular. During the first runs of the press, the non-image areas are removed from the support and thereby define the non-printing areas of the plate. These processing methods are environmentally friendly and highly desired by the customer as "chemistry free processing methods".

In particular printing plates designed for on-press processing, require lithographic coatings that are sufficiently soluble or dispersible on the press so that a good clean-out (complete removal of the coating at non-printing areas of the image) is obtained. Moreover, apart from the clean-out behaviour, also the presslife of such printing plates should be optimized. Both presslife and clean-out performance are determined by the interaction between the coating and the substrate: an optimal presslife requires sufficient adhesion between the substrate and the coating in the image areas, while a good clean-out requires minimal interaction of the coating with the substrate in the non-image areas upon processing. Thus maximizing the clean-out performance may result in reduced image adhesion and consequently in a reduced press life.

Therefore, a compound for improving the adhesion between the photopolymer coating and the support is often added to the printing plate precursor for increasing the resistance of the exposed areas during the processing step and for improving the durability of the plate in the printing process as disclosed in EP 851 299, EP 1 091 251, EP 1 695 822, EP 1 844 946, EP 2 105 797, EP 1 495 866, EP 1 500 498, EP 2 105 797 and EP 1 520 694.

However, it remains a challenge to obtain both (i) an excellent clean out of the non-image areas especially under non-aggressive processing conditions such as processing without the presence of a strong alkaline (pH≥12) solution— i.e. off-press processing with a gum solution or on-press processing with fountain and ink; (ii) combined with a high press durability during printing.

SUMMARY OF INVENTION

It is therefore an object of the present invention to provide a negative-working printing plate precursor characterized by both a sufficient clean out behaviour and a high presslife. It is also important that the precursor exhibits an improved shelf-life stability, i.e. an excellent clean-out and no toning when the precursor has been stored under critical conditions such as high temperature and high relative humidity before imaging and processing.

This object is realised by the printing plate precursor defined in claim 1 with preferred embodiments defined in the dependent claims. The printing plate precursor of the present invention has the specific feature that it contains a coating which includes a hydrophilic copolymer including monomeric units according to Formula I and Formula II and at least one group and/or moiety including a phosphor atom.

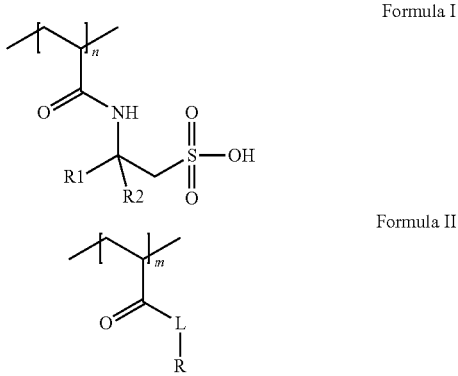

wherein

L represents O or NH;

n and m independently represents an integer greater than 0;

R represents hydrogen, an optionally substituted linear, branched or cyclic alkyl group, an optionally substituted aryl group, an optionally substituted aralkyl group or an optionally substituted heteroaryl group;

$R^1$ and $R^2$ independently represent an optionally substituted linear, branched or cyclic alkyl group.

According to the current invention, it was surprisingly found that the clean out behaviour is substantially improved by including the hydrophilic polymer according to the present invention whereby the occurrence of toning on paper prints is highly reduced and the presslife of the plate is substantially unaffected.

An insufficient clean-out means that, after processing, the non-image areas are not completely removed from the support or that the compounds remaining on the support in the non-image areas are too hydrophobic and, as a result, the hydrophilic property of the surface of the support is reduced. An insufficient clean-out results in toning, i.e. an undesirable increased tendency of ink-acceptance in the non-image areas of the prints.

The development is preferably carried out by treating the precursor with a gum solution, however more preferably by mounting the precursor on a plate cylinder of a lithographic printing press and rotating the plate cylinder while feeding dampening liquid and/or ink to the precursor.

It is a further object of the present invention to provide a method for making a lithographic printing plate comprising the steps of:

image-wise exposing the printing plate precursor including the coating as defined above to heat and/or light radiation whereby a lithographic image consisting of image areas and non-image areas is formed and whereby a colour change in the imaged areas is induced;

developing the exposed precursor.

Other features, elements, steps, characteristics and advantages of the present invention will become more apparent from the following detailed description of preferred embodiments of the present invention. Specific embodiments of the invention are also defined in the dependent claims.

DESCRIPTION OF EMBODIMENTS

The Lithographic Printing Plate Precursor

The lithographic printing plate precursor according to the present invention is negative-working, i.e. after exposure and development the non-exposed areas of the coating are removed from the support and define hydrophilic (non-printing) areas, whereas the exposed coating is not removed from the support and defines oleophilic (printing) areas. The hydrophilic areas are defined by the support which has a hydrophilic surface or is provided with a hydrophilic layer. The hydrophobic areas are defined by the coating, hardened upon exposing, optionally followed by a heating step. Areas having hydrophilic properties means areas having a higher affinity for an aqueous solution than for an (oleophilic) ink; areas having hydrophobic properties means areas having a higher affinity for an (oleophilic) ink than for an aqueous solution.

"Hardened" means that the coating becomes insoluble or non-dispersible for the developing solution and may be achieved through polymerization and/or crosslinking of the photosensitive coating, optionally followed by a heating step to enhance or to speed-up the polymerization and/or cross-linking reaction. In this optional heating step, hereinafter also referred to as "pre-heat", the plate precursor is heated, preferably at a temperature of about 80° C. to 150° C. and preferably during a dwell time of about 5 seconds to 1 minute.

The coating contains at least one layer including a photopolymerisable composition, said layer is also referred to as the "photopolymerisable layer". A protective overcoat layer may be provided on top of the photopolymerisable layer. The coating may further include other layers such as for example an intermediate layer, located between the support and the photopolymerisable layer and/or between the optional toplayer and the photopolymerisable layer, an adhesion improving layer, a hydrophilizing layer and/or other layers.

This photopolymerizable layer has a coating thickness preferably ranging between 0.1 and 5.0 g/m², more preferably between 0.3 and 3.0 g/m², most preferably between 0.4 and 1.5 g/m².

The printing plate of the present invention is in characterized that it can be exposed at a low energy density, i.e. below 190 mJ/m²; preferably between 70 and 190 mJ/m²; more preferably between 75 and 150 mJ/m² and most preferably between 80 and 120 mJ/m².

Photopolymer Coating

The Hydrophilic Substrate Adhesive Polymer

The lithographic printing plate precursor of the present invention includes a hydrophilic copolymer including at least one monomeric unit according to Formula I and at least one monomeric unit according to Formula II and at least one group and/or moiety including at least one phosphor atom. Said hydrophilic copolymer is also referred to as the "hydrophilic substrate adhesive polymer".

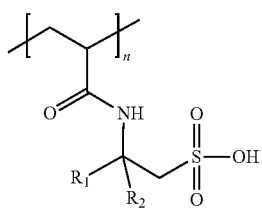

Formula I

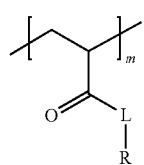

Formula II wherein

L represents O or NH;

n and m independently represents an integer greater than 0; preferably n and m independently represent an integer between 1 and 500, more preferably an integer between 2 and 250 and most preferably an integer between 3 and 100;

R represents hydrogen, an optionally substituted linear, branched or cyclic alkyl group, an optionally substituted aryl group, an optionally substituted aralkyl group or an optionally substituted heteroaryl group; preferably R represents an optionally substituted linear, branched or cyclic alkyl group—such as a methyl, ethyl or propyl group—or an optionally substituted aryl group;

$R^1$ and $R^2$ independently represent an optionally substituted linear, branched or cyclic alkyl group, preferably R represents an alkyl group such as a methyl, ethyl, n-propyl group or i-propyl group.

In a preferred embodiment the hydrophilic substrate adhesive polymer includes at least one monomeric unit according to Formula III, at least one monomeric unit according to Formula IV and at least one group and/or moiety including at least one phosphor atom.

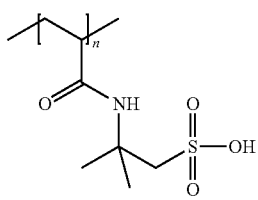

Formula III

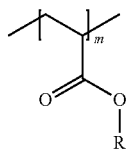

Formula IV wherein n and m independently represents an integer greater than 0; preferably n and m independently represents an integer between 1 and 500, more preferably an integer between 2 and 250 and most preferably between 3 and 100.

R represents hydrogen, an optionally substituted linear, branched or cyclic alkyl group, an optionally substituted aryl group, an optionally substituted aralkyl group or an optionally substituted heteroaryl group; preferably R represents an optionally substituted linear, branched or cyclic alkyl group—such as a methyl, ethyl or propyl group—or an optionally substituted aryl group.

The at least one group and/or moiety including at least one phosphor atom may be selected from for example phosphinate or phosphonate moieties. These moieties may be randomly present in the backbone of the hydrophilic substrate adhesive polymer and/or may be present as an endgroup in said polymer. A preferred moiety including at least one phosphor atom present as an endgroup is preferably presented by Formula V:

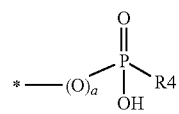

Formula V wherein a represents 0 or 1,

R4 represents —OH or a methyl group; and

* denotes the linking position to the monomeric units of the hydrophilic substrate adhesive polymer.

A preferred moiety including at least one phosphor atom randomly present in the backbone of the hydrophilic substrate adhesive polymer is preferably presented by Formula VI:

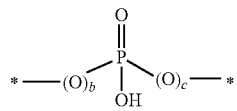

Formula VI wherein b and c independently represent 0 or 1, and

* denotes the linking positions to the monomeric units of the hydrophilic substrate adhesive polymer.

In a highly preferred embodiment, the hydrophilic substrate adhesive polymer includes at least one monomeric unit according to Formula I and at least one monomeric unit according to Formula VII. More preferably, the hydrophilic substrate adhesive polymer includes at least one monomeric unit according to Formula III and at least one monomeric unit according to Formula VII.

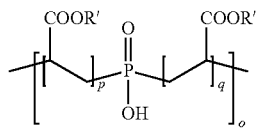

wherein
R' represents hydrogen, an optionally substituted linear, branched or cyclic alkyl group, an optionally substituted aryl group, an optionally substituted aralkyl group or an optionally substituted heteroaryl group, more preferably
R' represents hydrogen or an optionally substituted linear, branched or cyclic alkyl group, most preferably R' represents hydrogen;
o represents an integer between 1 and 100; and
p and q independently represent an integer between 0 and 500, more preferably between 2 and 250 and most preferably between 3 and 100.

The hydrophilic substrate adhesive polymer may be a random or a block-copolymer including the monomeric units according to Formulae I to IV and VII as defined above. In the latter embodiment, the copolymer may include alternating sequences of blocks consisting of the monomeric units according to Formula I or III, and the monomeric units according to Formula II, IV or VII. Such blocks may range from small blocks e.g. comprising less than 5 moieties, up to blocks comprising 100 moieties or more. The monomeric units according to Formulae I, II or IV may be all the same or different.

The hydrophilic substrate adhesive polymer according to the present invention can for example be synthesized by copolymerization of 2-acrylamido-2-methyl-1-propane-sulfonic acid (AMPS) and phosphino carboxylic acid (PCA). Other suitable methods including chain transfer agents such as sodium hypophosphites are described in EP 618 240 and EP 405 818.

The hydrophilic substrate adhesive polymer may be present in the coating in an amount between 5 and 100 mg/m$^2$, more preferably in an amount between 10 and 50 mg/m$^2$ and most preferably in an amount between 12 and 25 mg/m$^2$.

The weight average molecular weight (Mw) of the copolymers according to the present invention is preferably below 100000, more preferably below 50000 and most preferably between 1000 and 20000. The weight average molecular weight (Mw) may be determined by size exclusion chromatography.

Optionally other monomeric units may be present in the hydrophilic substrate adhesive polymer. These other monomeric units may be selected from (meth)acrylic acid, maleic acid, crotonic acid, itaconic acid, vinyl benzoic acid, vinyl phenyl acetic acid, sulphoethyl (meth)acrylate, sulphopropyl (meth)acrylate, sulphobutyl (meth)acrylate, (meth)acrylamido-2-propane-sulphonic acid, vinylsulphonic acid, styrene sulphonic acid, vinyl phenol, 4-hydroxy styrene, ethyleneoxide, propyleneoxide, methylvinylether, vinyl alcohol, hydrolysed vinylacetate, maleic anhydride or maleimide grafted with poly(ethyleneoxide) group having at least 2 ethyleneoxide groups, N-vinylpirrolidone, N-vinylcaprolactam, (meth)acrylamide, N-methylol(meth)acrylamide, N-methyl(meth)acrylamide, N-ethyl(meth)acrylamide, N-isopropyl(meth)acrylamide, 2-(dimethylamino)ethyl (meth)acrylate, hydroxyethyl(meth)acrylate, quaternised amino ethyl (meth)acrylate, quaternised amino propyl (meth)acrylamide and quaternised vinyl pyridine, and salts thereof, and each of these monomers being optionally substituted. More preferred second monomeric units are sulphoethyl (meth)acrylate, styrene sulphonic acid, vinyl alcohol, (meth)acrylic acid, maleic acid, crotonic acid, itaconic acid, (meth)acrylamide, N-methylol(meth)acrylamide, N-vinylpirrolidone and ethyleneoxide, and salts thereof, and each of these monomers being optionally substituted. Most preferred second monomeric units are (meth)acrylic acid, maleic acid, crotonic acid, itaconic acid, vinyl alcohol and ethyleneoxide, and salts thereof, and each of these monomers being optionally substituted.

The hydrophilic substrate adhesive polymer according to the present invention may be present in the photopolymerisable layer, and/or in the optional toplayer, and/or in any other optional layer such as for example an intermediate layer located between the support and the photopolymerisable layer, an adhesion improving layer, a hydrophilizing layer and/or other layers.

The Adhesion Promoting Compound

The lithographic printing plate precursor of the present invention preferably includes an adhesion promoting compound; i.e. a compound capable of interacting with the support. The adhesion promoting compound preferably includes an addition-polymerizable ethylenically unsaturated bond and a functional group capable of interacting with the support. Under "interacting" is understood each type of physical and/or chemical reaction or process whereby, between the functional group and the support, a bond is formed which can be a covalent bond, an ionic bond, a complex bond, a coordinate bond or a hydrogen-bridge bond, and which can be formed by an adsorption process, a chemical reaction, an acid-base reaction, a complex-forming reaction or a reaction of a chelating group or a ligand.

The adhesion promoting compound is present in the photopolymerizable layer, and/or in the optional toplayer, and/or in any other optional layer such as for example an intermediate layer located between the support and the photopolymerisable layer, an adhesion improving layer, a hydrophilizing layer and/or other layers.

The adhesion promoting compound may be selected from at least one of the low molecular weight compounds or polymeric compounds as described in EP 2 916 171 [0058], EP 851 299 from lines 22 on page 3 to line 1 on page 4, EP1 500 498 from paragraph [0023] on page 7 to paragraph [0052] on page 20, EP 1 495 866 paragraph [0030] on page 5 to paragraph [0049] on page 11, EP 1 091 251 from paragraph [0014] on page 3 to paragraph [0018] on page 20, and EP 1 520 694 from paragraph [0023] on page 6 to paragraph [0060] on page 19. Preferred compounds are those compounds which comprise a phosphate or phosphonate group as functional group capable of adsorbing on the aluminium support and which comprise an addition-polymerizable ethylenic double bond reactive group. Also preferred are those compounds which comprises a tri-alkyl-oxy silane groups, hereinafter also referred to as "trialkoxy silane" groups, wherein the alkyl is preferably methyl or ethyl, or wherein the trialkyloxy silane groups are at least partially hydrolysed to silanol groups, as functional group capable of adsorbing on the support, especially silane coupling agents having an addition-polymerizable ethylenic double bond reactive group.

The adhesion promoting compound may be present in the coating in an amount comprised between 1 and 50 wt %, preferably between 3 and 30 wt %, more preferably between 5 and 20 wt % of the non-volatile components of the coating composition.

The adhesion promoting compound and the hydrophilic substrate adhesive polymer according to the present invention are preferably both present in the coating; i.e. either in the photopolymerisable layer, and/or in the toplayer, and/or an intermediate layer located between the support and the photopolymerisable layer, an adhesion improving layer, a hydrophilizing layer and/or other layers.

Photopolymerisable Compound

The photopolymerisable layer includes at least one polymerisable compound, a photoinitiator and optionally a binder. The photopolymerisable layer has a coating thickness preferably ranging between 0.2 and 5.0 $g/m^2$, more preferably between 0.4 and 3.0 $g/m^2$, most preferably between 0.6 and 1.5 $g/m^2$.

According to a preferred embodiment of the present invention, the polymerisable compound is a polymerisable monomer or oligomer including at least one terminal ethylenic unsaturated group, hereinafter also referred to as "free-radical polymerisable monomer". The polymerisation involves the linking together of the free-radical polymerisable monomers. Suitable free-radical polymerisable monomers include, for example, multifunctional (meth)acrylate monomers (such as (meth)acrylate esters of ethylene glycol, trimethylolpropane, pentaerythritol, ethylene glycol, ethoxylated trimethylolpropane, urethane (meth)acrylate) and oligomeric amine di(meth)acrylates. The (meth)acrylic monomers may also have other ethylenically unsaturated groups or epoxide groups in addition to the (meth)acrylate group. The (meth)acrylate monomers may also contain an acidic (such as a carboxylic acid or phosphoric acid) or basic (such as an amine) functionality.

Suitable free-radical polymerisable monomers are disclosed in [0042] and [0050] of EP 2916171.

The Initiator

Any free radical initiator capable of generating free radicals upon exposure directly or in the presence of a sensitizer, is according to this invention a suitable initiator, also referred to herein as photoinitiator. Suitable examples of photoinitiators include onium salts, carbon-halogen bond-containing compounds such as [1,3,5] triazines having trihalomethyl groups, organic peroxides, aromatic ketones, thio compounds, azo based polymerization initiators, azide compounds, ketoxime esters, hexaarylbisimidazoles, metallocenes, active ester compounds, borates and quinonediazides. Of these, onium salts, especially iodonium and/or sulfonium salts are preferable in view of storage stability.

More specific suitable free-radical initiators include, for example, the derivatives of acetophenone (such as 2,2-dimethoxy-2-phenylacetophenone, and 2-methyl-1-[4-(methylthio) phenyll-2-morpholino propan-I-one); benzophenone; benzil; ketocoumarin (such as 3-benzoyl-7-methoxy coumarin and 7-methoxy coumarin); xanthone; thioxanthone; benzoin or an alkyl-substituted anthraquinone; onium salts (such as diaryliodonium hexafluoroantimonate, diaryliodonium triflate, (4-(2-hydroxytetradecyl-oxy)-phenyl) phenyliodonium hexafluoroantimonate, triarylsulfonium hexafluorophosphate, triarylsulfonium p-toluenesulfonate, (3-phenylpropan-2-onyl) triaryl phosphonium hexafluoroantimonate, and N-ethoxy(2-methyl) pyridinium hexafluorophosphate, and onium salts as described in U.S. Pat. Nos. 5,955,238, 6,037,098, and 5,629,354); borate salts (such as tetrabutylammonium triphenyl(n-butyl)borate, tetraethylammonium triphenyl(n-butyl)borate, diphenyliodonium tetraphenylborate, diphenyliodonium tetraphenylborate wherein the phenyl groups of the iodonium salt are substituted with a group including at least six carbon atoms, and triphenylsulfonium triphenyl(n-butyl)borate, and borate salts as described in U.S. Pat. Nos. 6,232,038 and 6,218,076); haloalkyl substituted s-triazines (such as 2,4-bis (trichloromethyl)-6-(p-methoxy-styryl)-s-triazine, 2,4-bis (trichloromethyl)-6-(4-methoxy-naphth-1-yl)-s-triazine, 2,4-bis(trichloromethyl)-6-piperonyl-s-triazine, and 2,4-bis (trichloromethyl)-6-[(4-ethoxy-ethylenoxy)-phen-1-yl]-s-triazine, and s-triazines as described in U.S. Pat. Nos. 5,955,238, 6,037,098, 6,010,824 and 5,629,354); and titanocene (bis(etha.9-2,4-cyclopentadien-1-yl) bis[2,6-difluoro-3-(IH-pyrrol-1-yl)phenyl) titanium). Onium salts, borate salts, and s-triazines are preferred free radical initiators. Diaryliodonium salts and triarylsulfonium salts are preferred onium salts. Triarylalkylborate salts are preferred borate salts. Trichloromethyl substituted s-triazines are preferred s-triazines. These initiators may have optional substituents and may be used alone or in combination.

Optionally substituted trihaloalkyl sulfones wherein halo independently represents bromo, chloro or iodo and sulfone is a chemical compound containing a sulfonyl functional group attached to two carbon atoms, are particularly preferred initiators. Tribromomethyl phenyl sulfones are most preferred initiators. More details concerning this initiator can be found in patent application WO2019/179995 paragraphs [0029] to [0040].

The amount of the initiator typically ranges from 0.05 to 30% by weight, preferably from 0.1 to 15% by weight, most preferably from 0.2 to 10% by weight relative to the total dry weight of the components in the photopolymerisable composition.

The photopolymerisable layer may also comprise a co-initiator. Typically, a co-initiator is used in combination with a free radical initiator. Suitable co-initiators for use in the photopolymer coating are disclosed in U.S. Pat. Nos. 6,410,205; 5,049,479; EP 1 079 276, EP 1 369 232, EP 1 369 231, EP 1 341 040, US 2003/0124460, EP 1 241 002, EP 1 288 720 and in the reference book including the cited references: Chemistry & Technology UV & EB formulation for coatings, inks & paints—Volume 3—Photoinitiators for Free Radical and Cationic Polymerisation by K. K. Dietliker—Edited by P. K. T. Oldring—1991—ISBN 0 947798161. Specific co-initiators, as described in EP 107 792, may be present in the photopolymerizable layer to further increase the sensitivity. Preferred co-initiators are disclosed in EP 2 916 171 [0051].

A very high sensitivity can be obtained by including an optical brightener as sensitizer in the coating. Suitable examples of optical brighteners as sensitizers are described in WO 2005/109103 page 24, line 20 to page 39. Useful sensitizers can be selected from the sensitizing dyes disclosed in U.S. Pat. Nos. 6,410,205; 5,049,479; EP 1 079 276, EP 1 369 232, EP 1 369 231, EP 1 341 040, US 2003/ 0124460, EP 1 241 002 and EP 1 288 720.

Specific co-initiators, as described in EP 107 792, may be present in the photopolymerizable layer to further increase the sensitivity. Preferred co-initiators are sulfur-compounds, especially thiols like e.g. 2-mercaptobenzothiazole, 2-mercaptobenzoxazole, 2-mercapto-benzimidazole, 4-methyl-3-propyl-1,2,4-triazoline-5-thione, 4-methyl-3-n-heptyl-1,2,4-triazoline-5-thione, 4-phenyl-3-n-heptyl-1,2,4-triazoline-5-thione, 4-phenyl-3,5-dimercapto-1,2,4-triazole, 4-n-decyl-3, 5-dimercapto-1,2,4-triazole, 5-phenyl-2-mercapto-1,3,4-oxadiazole, 5-methylthio-1,3,4-thiadiazoline-2-thione, 5-hexylthio-1,3,4-thiadiazoline-2-thione, mercaptophenyltetrazole, pentaerythritol mercaptopropionate, butyric acid-3-mercapto-neopentanetetrayl ester, pentaerythritol tetra(thioglycolate). Other preferred co-initiators are polythioles as disclosed in WO 2006/048443 and WO 2006/048445. These polythiols may be used in combination with the above described thiols, e.g. 2-mercaptobenzothiazole.

The Binder

The photopolymerizable layer preferably includes a binder. The binder can be selected from a wide series of organic polymers. Compositions of different binders can also be used. Useful binders are described in for example EP 1 043 627 in paragraph [0013], WO2005/111727 page 17 line 21 to page 19 line 30 and in WO2005/029187 page 16 line 26 to page 18 line 11.

The photopolymerizable layer may include discrete particles, i.e. particulate shaped polymers including homopolymers or copolymers prepared from monomers such as ethylene, styrene, vinyl chloride, methyl acrylate, ethyl acrylate, methyl methacrylate, ethyl methacrylate, acrylonitrile, vinyl carbazole, acrylate or methacrylate, or mixtures thereof.

Preferably the discrete particles are particles which are suspended in the polymerisable composition. The presence of discrete particles tends to promote developability of the unexposed areas.

Thermally reactive polymer fine particles including a thermally reactive group such as an ethylenically unsaturated group, a cationic polymerizable group, an isocyanate group, an epoxy group, a vinyloxy group, and a functional group having an active hydrogen atom, a carboxy group, a hydroxy group, an amino group or an acid anhydride.

The average particle diameter of the polymer fine particle is preferably 0.01 mm to 3.0 mm. Particulate polymers in the form of microcapsules, microgels or reactive microgels are suitable as disclosed in EP 1 132 200; EP 1 724 112 and US 2004/106060.

Specific examples of binders are described in U.S. Pat. No. 6,899,994; US 2004/0260050, US 2005/0003285, US 2005/0170286, US 2005/0123853 and EP 2 916 171 in [0029], [0030] and [0031]. Other suitable binders as described in EP 2 471 655, EP 2 492 748 and EP 2 660 068 include multifunctional thiols having 6 to 10 functional groups as a nucleus (central skeleton) and polymer chains connected to the nucleus through sulfide bonds. In addition, the imageable layer may optionally comprise one or more co-binders. Typical co-binders are water-soluble or water-dispersible polymers, such as, cellulose derivatives, polyvinylalcohol, polyacrylic acid poly(meth)acrylic acid, polyvinylpyrrolidone, polylactide, polyvinylphosphonic acid, synthetic co-polymers, such as co-polymers of an alkoxy polyethylene glycol (meth)acrylate. Specific examples of co-binders are described in US 2004/0260050, US 2005/0003285 and US 2005/0123853.

Other Ingredients

The photopolymerisable layer may also comprise particles which increase the resistance of the coating against manual or mechanical damage. The particles may be inorganic particles, organic particles or fillers such as described in for example U.S. Pat. No. 7,108,956. More details of suitable spacer particles described in EP 2 916 171 [0053] to [0056].

The photopolymerizable layer may also comprise an inhibitor. Particular inhibitors for use in the photopolymer coating are disclosed in U.S. Pat. No. 6,410,205, EP 1 288 720 and EP 1 749 240.

The photopolymerizable layer may include a leuco dye which forms a coloured compound upon exposure to light and/or heat, preferably infrared light, whereby a print-out image is formed. More information with regards to suitable leuco dyes can be found in unpublished application EP19153178 [0069] to [0085].

The photopolymerisable layer may further include at least one borate compound. The borate compound preferably refers to a chemical compound including a borate anion and preferably a cation as counterion. The borate anion may originate from the counterion of the photoinitiator; e.g. a diphenyliodonium photoinitiator and/or the counterion of the infrared absorbing compound described above or any other salt e.g. sodium tetraphenylborate.

Preferably, the borate anion is a tetrahedral boron anion and may be represented by the following Formula A:

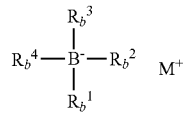

Formula A wherein $R_b^1$, $R_b^2$, $R_b^3$ and $R_b^4$ are independently an optionally substituted aliphatic hydrocarbon group, an optionally substituted aryl or heteroaryl group; alternatively, two or more of $R_b^1$, $R_b^2$, $R_b^3$ and $R_b^4$ can be joined together to form a heterocyclic ring with the boron atom, such a ring may include up to seven carbon, nitrogen, oxygen and/or nitrogen atoms. Preferably, $R_b^1$, $R_b^2$, $R_b^3$ and $R_b^4$ are independently an optionally substituted aryl or heteroaryl group. More preferably, $R_b^1$, $R_b^2$, $R_b^3$ and $R_b^4$ are independently an optionally substituted aryl group. Most preferably, the borate compound includes at least one optionally substituted phenyl group, more preferably at least two optionally substituted phenyl groups, even more preferably at least three optionally substituted phenyl groups and most preferably four optionally substituted phenyl groups.

$M^+$ is an alkali metal cation such as e.g. $Li^+$, $Na^+$, $K^+$ or an optional substituted onium ion. Examples of the optionally substituted onium ion include pyridinium, ammonium, iodonium or sulfonium.

Examples of a pyridinium ion include N-alkyl-3-pyridinium group, an N-benzyl-3-pyridinium group, an N-(alkoxy polyalkyleneoxy alkyl)-3-pyridinium group, an N-alkoxycarbonylmethyl-3-pyridinium group, an N-alkyl-4pyridinium group, an N-benzyl-4-pyridinium group, an N-(alkoxy polyalkyleneoxy alkyl)-4-pyridinium group, an N-alkoxycarbonylmethyl-4-pyridinium group, N-alkyl-3,5-dimethyl-4-pyridinium, N-alkyl-3-pyridinium group or N-alkyl-4-pyridinium, an N-methyl-3-pyridinium, an N-octyl-3pyridinium, an N-methyl-4-pyridinium, or an N-octyl-4-pyridinium is particularly preferred, and an N-octyl-3-pyridinium group or an N-octyl-4-pyridinium group is most preferred.

The optional substituted onium ion is preferably an ammonium ion represented by Formula B:

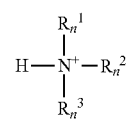

Formula B wherein $R_n^1$, $R_n^2$ and $R_n^3$ are independently an optionally substituted aliphatic hydrocarbon group, an optionally substituted aryl or heteroaryl group or a halogen atom.

The optional substituted onium ion is most preferably a iodonium ion; more preferably an optionally substituted dipenyl iodonium salt. Diphenyl iodonium salts substituted with electron-donating groups, for example, alkyl groups or alkoxyl groups, and asymmetric diphenyl iodonium salts are particularly preferred. The phenyl groups of the iodonium ion are preferably substituted with a group including at least six carbon atoms.

Specific examples of borate compounds including a iodonium ion include 4-hexyloxyphenyl-2,4-diethoxyphenyl iodonium tetrafluoroborate, 4-octyloxyphenyl phenyliodonium tetraphenylborate, [4-[(2-hydroxytetradecyl)-oxy]phenyl]phenyliodonium tetraphenylborate, bis(4-t-butylphenyl) iodonium tetraphenylborate, 4-methylphenyl-4'-hexylphenyliodonium tetraphenylborate-4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyliodonium tetraphenylborate, 2-5 methyl-4-t-butylphenyl-4'-methylphenyliodonium tetraphenylborate, 4-methylphenyl-4'-pentylphenyliodonium tetrakis[3,5-bis(trifluoromethyl)phenyl]borate, 4-methoxyphenyl-4'-cyclohexylphenyliodonium tetrakis (pentafluorophenyl) borate, 4-methylphenyl-4'-dodecylphenyliodonium tetrakis(4-fluorophenyl)borate, bis(dodecylphenyl)iodonium tetrakis(pentatluorophenyl)borate, and bis(4-t-butylphenyl)iodonium tetrakis(limidazolyl) borate. Preferred compounds include bis(4-t-butylphenyl) iodonium tetraphenylborate, 4-methylphenyl-4'-hexylphenyliodonium tetraphenylborate, 2-methyl-4-t-butylphenyl-4'-methylphenyliodonium tetraphenylborate, and 4-methylphenyl-4'-cyclohexylphenyliodonium tetraphenylborate.

The borate compound may be present in an amount comprised between 0.05 and 30% by weight, more preferably between 0.1 and 25% by weight, and most preferably from 0.5 and 15% by weight relative to the components of the photopolymerisable layer.

Various surfactants may be added into the photopolymerisable layer to allow or enhance the developability of the precursor; especially developing with a gum solution. Both polymeric and small molecule surfactants for example non-ionic surfactants are preferred. More details are described in EP 2 916 171 [0059].

Toplayer

The coating may include a toplayer or protective overcoat layer which may act as an oxygen barrier layer. Low molecular weight substances present in the air may deteriorate or even inhibit image formation and therefore a toplayer is applied to the coating. A toplayer should preferably be easily removable during development, adhere sufficiently to the photopolymerisable layer or optional other layers of the coating and should preferably not inhibit the transmission of light during exposure. The toplayer is preferably provided on top of the photopolymerisable layer.

The optional toplayer may further include a binder. Preferred binders which can be used in the toplayer are polyvinyl alcohol. The polyvinylalcohol has preferably a hydrolysis degree ranging between 74 mol % and 99 mol %, more preferably between 80-98%. The weight average molecular weight of the polyvinylalcohol can be measured by the viscosity of an aqueous solution, 4% by weight, at 20° C. as defined in DIN 53 015, and this viscosity number ranges preferably between 2 and 26, more preferably between 2 and 15, most preferably between 2 and 10.

The optional toplayer may include a halogenated polymer which is preferably a hydrophobic polymer, i.e. not soluble or swellable in water at about neutral pH. This binder may be used in the toplayer in the form of a dispersion; i.e. an emulsion or suspension. The amount of the halogenated binder in the toplayer may be between 30% wt and 96% wt, more preferably between 40% wt and 90% wt and most preferably between 50% wt and 85% wt. The halogenated binder preferably includes between 60% wt and 95% wt monomeric units derived from vinylidene monomers such as vinylidene fluoride, vinylidene chloride, vinylidene bromide and/or vinylidene iodide.

The optional toplayer may optionally include other ingredients such as inorganic or organic acids, matting agents, surfactants such as anionic surfactants, e.g. sodium alkyl sulphate or sodium alkyl sulphonate; amphoteric surfactants, e.g. alkylaminocarboxylate and alkylamino-dicarboxylate; non-ionic surfactants, e.g. polyoxyethylene alkyl phenyl ether, (co)polymers comprising siloxane and/or perfluoroalkyl units and/or oligo(alkylene oxide) units; fillers, (organic) waxes, alkoxylated alkylene diamines as for example disclosed in EP 1 085 380 (paragraph [0021] and [0022]), glycerine, inorganic particles, pigments or wetting agents as disclosed in EP 2 916 171. The optional toplayer may further include an infrared absorbing compound which is capable of forming a coloured compound—whereby a print-out image is formed—upon exposure to infrared light and/or heat. More information with regards to such infrared absorbing dyes are retrievable in unpublished application EP 20181812 [0055] to [0072].

The coating thickness of the optional toplayer may be between 0.10 and 1.75 g/m², more preferably between 0.20 and 1.30 g/m², more preferably between 0.25 and 1.0 g/m² and most preferably between 0.30 and 0.80 g/m². Preferably, the optional toplayer has a coating thickness between 0.25 and 1.75 g/m² and comprises a polyvinylalcohol having a hydrolysis degree ranging between 74 mol % and 99 mol % and a viscosity number as defined above ranging between 2 and 26 mPas.

The hydrophilic polymers in the protective overcoat layer may result in a problematic viscosity increase of press chemicals such as for example fountain solution and/or developer solution. Therefore, the coat weight of the hydrophilic polymers and/or thickness of the protective overcoat layer should preferably not be too high; e.g. above the ranges given above.

Definitions

An aliphatic hydrocarbon group preferably represents an alkyl, cycloalkyl, alkenyl, cyclo alkenyl or alkynyl group; suitable groups thereof are described below. An aromatic hydrocarbon group preferably represents a hetero(aryl) group; suitable hetero(aryl) groups—i.e. suitable aryl or heteroaryl groups—are described below.

The term "alkyl" herein means all variants possible for each number of carbon atoms in the alkyl group i.e. methyl, ethyl, for three carbon atoms: n-propyl and isopropyl; for four carbon atoms: n-butyl, isobutyl and tertiary-butyl; for five carbon atoms: n-pentyl, 1,1-dimethyl-propyl, 2,2-dimethylpropyl and 2-methyl-butyl, etc. Examples of suitable alkyl groups are methyl, ethyl, n-propyl, isopropyl, n-butyl, 1-isobutyl, 2-isobutyl and tertiary-butyl, n-pentyl, n-hexyl, chloromethyl, trichloromethyl, iso-propyl, iso-butyl, iso-pentyl, neo-pentyl, 1-methylbutyl and iso-hexyl, 1,1-dimethyl-propyl, 2,2-dimethylpropyl and 2-methyl-butyl, cyclopropyl, cyclobutyl, cyclopentyl, cyclohexyl and methylcyclohexyl groups. Preferably, the alkyl group is a $C_1$ to $C_6$-alkyl group.

A suitable alkenyl group is preferably a $C_2$ to $C_6$-alkenyl group such as an ethenyl, n-propenyl, n-butenyl, n-pentenyl, n-hexenyl, iso-propenyl, iso-butenyl, iso-pentenyl, neo-pentenyl, 1-methylbutenyl, iso-hexenyl, cyclopentenyl, cyclohexenyl and methylcyclohexenyl group.

A suitable alkynyl group is preferably a $C_2$ to $C_6$-alkynyl group; a suitable aralkyl group is preferably a phenyl group or naphthyl group including one, two, three or more $C_1$ to $C_6$-alkyl groups; a suitable alkaryl group is preferably a $C_1$ to $C_6$-alkyl group including an aryl group, preferably a phenyl group or naphthyl group.

A cyclic group or cyclic structure includes at least one ring structure and may be a monocyclic- or polycyclic group, meaning one or more rings fused together.

Examples of suitable aryl groups may be represented by for example an optionally substituted phenyl, benzyl, tolyl or an ortho-meta- or para-xylyl group, an optionally substituted naphtyl, anthracenyl, phenanthrenyl, and/or combinations thereof. The heteroaryl group is preferably a monocyclic or polycyclic aromatic ring comprising carbon atoms and one or more heteroatoms in the ring structure, preferably, 1 to 4 heteroatoms, independently selected from nitrogen, oxygen, selenium and sulphur.

Preferred examples thereof include an optionally substituted furyl, pyridinyl, pyrimidyl, pyrazoyl, imidazoyl, oxazoyl, isoxazoyl, thienyl, tetrazoyl, thiazoyl, (1,2,3)triazoyl, (1,2,4)triazoyl, thiadiazoyl, thiofenyl group and/or combinations thereof.

A cyclic group or cyclic structure includes at least one ring structure and may be a monocyclic- or polycyclic group, meaning one or more rings fused together.

Halogens are selected from fluorine, chlorine, bromine or iodine.

The term "substituted", in e.g. substituted alkyl group means that the alkyl group may be substituted by other atoms than the atoms normally present in such a group, i.e. carbon and hydrogen. For example, a substituted alkyl group may include a halogen atom or a thiol group. An unsubstituted alkyl group contains only carbon and hydrogen atoms.

The optional substituents on the alkyl, cycloalkyl, alkenyl, cycloalkenyl, alkynyl, aralkyl, alkaryl, aryl and heteroaryl group are preferably selected from hydroxy, —Cl, —Br, —I, —OH, —SH, —CN, —NO$_2$, an alkyl group such as a methyl or ethyl group, an alkoxy group such as a methoxy or an ethoxy group, an aryloxy group, a carboxylic acid group or an alkyl ester thereof, a sulphonic acid group or an alkyl ester thereof, a phosphonic acid group or an alkyl ester thereof, a phosphoric acid group or an an ester such as an alkyl ester such as methyl ester or ethyl ester, a thioalkyl group, a thioaryl group, thioheteroaryl, —SH, a thioether such as a thioalkyl or thioaryl, ketone, aldehyde, sulfoxide, sulfone, sulfonate ester, sulphonamide, an amino, ethenyl, alkenyl, alkynyl, cycloalkyl, alkaryl, aralkyl, aryl, heteroaryl or heteroalicyclic group and/or combinations thereof.

Monomeric units refer to the building blocks making up a polymer.

Support

The lithographic printing plate used in the present invention comprises a support which has a hydrophilic surface or which is provided with a hydrophilic layer. The support is preferably a grained and anodized aluminium support, well known in the art. Suitable supports are for example disclosed in EP 1 843 203 (paragraphs [0066] to [0075]). The surface roughness, obtained after the graining step, is often expressed as arithmetical mean center-line roughness Ra (ISO 4287/1 or DIN 4762) and may vary between 0.05 and 1.5 µm. The aluminum substrate of the current invention has preferably an Ra value between 0.1 and 1.4 µm, more preferably between 0.3 and 1.0 µm and most preferably between 0.4 and 0.9 µm. The lower limit of the Ra value is preferably about 0.1 µm. More details concerning the preferred Ra values of the surface of the grained and anodized aluminum support are described in EP 1 356 926. By anodising the aluminum support, an $Al_2O_3$ layer is formed and the anodic weight (g/m$^2$ $Al_2O_3$ formed on the aluminum surface) varies between 1 and 8 g/m$^2$. The anodic weight is preferably ≥2.0 g/m$^2$, more preferably ≥2.5 g/m$^2$ and most preferably ≥3.0 g/m$^2$ The grained and anodized aluminium support may be subjected to so-called post-anodic treatments, for example a treatment with polyvinylphosphonic acid or derivatives thereof, a treatment with polyacrylic acid or derivatives thereof, a treatment with potassium fluorozirconate or a phosphate, a treatment with an alkali metal silicate, or combinations thereof. Treatment of the edges of the support as described in for example US 2017/320351 may be of interest to prevent occurrence of printing edges. Alternatively, the support may be treated with an adhesion promoting compound such as those described in EP 1 788 434 in [0010] and in WO 2013/182328. However, for a precursor optimized to be used without a pre-heat step it is preferred to use a grained and anodized aluminium support without any post-anodic treatment.

Besides an aluminium support, a plastic support, for example a polyester support, provided with one or more hydrophilic layers as disclosed in for example EP 1 025 992 may also be used.

Exposure Step

The printing plate precursor is preferably image-wise exposed by a laser emitting IR light. Preferably, the image-wise exposing step is carried out off-press in a platesetter, i.e. an exposure apparatus suitable for image-wise exposing the precursor with a laser such as a laser diode, emitting around 830 nm or a Nd YAG laser emitting around 1060 nm, a violet laser, emitting around 400 nm, or a gas laser such as an Ar laser, or with a digitally modulated UV-exposure set-up, using e.g. digital mirror devices, or by a conventional exposure in contact with a mask. In a preferred embodiment of the present invention, the precursor is image-wise exposed by a laser emitting IR light or violet light, more preferably by a laser emitting IR light.

Preheat Step

After the exposing step, the precursor may be pre-heated in a preheating unit, preferably at a temperature of about 80° C. to 150° C. and preferably during a dwell time of about 5 seconds to 1 minute. This preheating unit may comprise a heating element, preferably an IR-lamp, an UV-lamp, heated air or a heated roll. Such a preheat step can be used for printing plate precursors comprising a photopolymerisable composition to enhance or to speed-up the polymerization and/or crosslinking reaction.

Development Step

Subsequently to the exposing step or the preheat step, when a preheat step is present, the plate precursor may be processed (developed). Before developing the imaged precursor, a pre-rinse step might be carried out especially for the negative-working lithographic printing precursors having a protective oxygen barrier or topcoat. This pre-rinse step can be carried out in a stand-alone apparatus or by manually rinsing the imaged precursor with water or the pre-rinse step can be carried out in a washing unit that is integrated in a processor used for developing the imaged precursor. The washing liquid is preferably water, more preferably tap water. More details concerning the wash step are described in EP 1 788 434 in [0026].

During the development step, the non-exposed areas of the image-recording layer are at least partially removed without essentially removing the exposed areas. The processing liquid, also referred to as developer, can be applied to the plate e.g. by rubbing with an impregnated pad, by dipping, immersing, coating, spincoating, spraying, pouring-on, either by hand or in an automatic processing apparatus. The treatment with a processing liquid may be combined with mechanical rubbing, e.g. by a rotating brush. During the development step, any water-soluble protective layer present is preferably also removed. The development is preferably carried out at temperatures between 20 and 40° C. in automated processing units.

In a highly preferred embodiment, the processing step as described above is replaced by an on-press processing whereby the imaged precursor is mounted on a press and processed on-press by rotating said plate cylinder while feeding dampening liquid and/or ink to the coating of the precursor to remove the unexposed areas from the support. In a preferred embodiment, supply of dampening liquid and ink is started simultaneously, or only ink can be supplied during a number of revolutions before switching on the supply of dampening liquid. In an alternative embodiment, only dampening liquid is supplied to the plate during start-up of the press and after a number of revolutions of the plate cylinder also the ink supply is switched on.

The processing step may also be performed by combining embodiments described above, e.g. combining development with a processing liquid with development on-press by applying ink and/or fountain.

Processing Liquid

The processing liquid may be an alkaline developer or solvent-based developer. Suitable alkaline developers have been described in US2005/0162505. An alkaline developer is an aqueous solution which has a pH of at least 11, more typically at least 12, preferably from 12 to 14. Alkaline developers typically contain alkaline agents to obtain high pH values can be inorganic or organic alkaline agents. The developers can comprise anionic, non-ionic and amphoteric surfactants (up to 3% on the total composition weight); biocides (antimicrobial and/or antifungal agents), antifoaming agents or chelating agents (such as alkali gluconates), and thickening agents (water soluble or water dispersible polyhydroxy compounds such as glycerine or polyethylene glycol).

Preferably, the processing liquid is a gum solution whereby during the development step the non-exposed areas of the photopolymerisable layer are removed from the support and the plate is gummed in a single step. The development with a gum solution has the additional benefit that, due to the remaining gum on the plate in the non-exposed areas, an additional gumming step is not required to protect the surface of the support in the non-printing areas. As a result, the precursor is processed and gummed in one single step which involves a less complex developing apparatus than a developing apparatus comprising a developer tank, a rinsing section and a gumming section. The gumming section may comprise at least one gumming unit or may comprise two or more gumming units. These gumming units may have the configuration of a cascade system, i.e. the gum solution, used in the second gumming unit and present in the second tank, overflows from the second tank to the first tank when gum replenishing solution is added in the second gumming unit or when the gum solution in the second gumming unit is used once-only, i.e. only starting gum solution is used to develop the precursor in this second gumming unit by preferably a spraying or jetting technique. More details concerning such gum development is described in EP1 788 444.

A gum solution is typically an aqueous liquid which comprises one or more surface protective compounds that are capable of protecting the lithographic image of a printing plate against contamination, e.g. by oxidation, fingerprints, fats, oils or dust, or damaging, e.g. by scratches during handling of the plate. Suitable examples of such surface protective compounds are film-forming hydrophilic polymers or surfactants. The layer that remains on the plate after treatment with the gum solution preferably comprises between 0.005 and 20 $g/m^2$ of the surface protective compound, more preferably between 0.010 and 10 $g/m^2$, most preferably between 0.020 and 5 $g/m^2$. More details concerning the surface protective compounds in the gum solution can be found in WO 2007/057348 page 9 line 3 to page 11 line 6. As the developed plate precursor is developed and gummed in one step, there is no need to post-treat the processed plate.

The gum solution preferably has a pH value between 3 and 11, more preferably between 4 and 10, even more preferably between 5 and 9, and most preferably between 6 and 8. A suitable gum solution is described in for example EP 1 342 568 in [0008] to [0022] and WO2005/111727. The gum solution may further comprise an inorganic salt, an anionic surfactant, a wetting agent, a chelate compound, an antiseptic compound, an antifoaming compound and/or an ink receptivity agent and/or combinations thereof. More details about these additional ingredients are described in WO 2007/057348 page 11 line 22 to page 14 line 19.

Drying and Baking Step

After the processing step the plate may be dried in a drying unit. In a preferred embodiment the plate is dried by heating the plate in the drying unit which may contain at least one heating element selected from an IR-lamp, an UV-lamp, a heated metal roller or heated air.

After drying the plate can optionally be heated in a baking unit. More details concerning the heating in a baking unit can be found in WO 2007/057348 page 44 line 26 to page 45 line 20.

According to the present invention there is also provided a method for making a negative-working lithographic printing plate comprising the steps of imagewise exposing a printing plate precursor followed by developing the imagewise exposed precursor so that the non-exposed areas are dissolved in the developer solution. The development is preferably carried out by treating the precursor with a gum solution, however more preferably by mounting the precursor on a plate cylinder of a lithographic printing press and rotating the plate cylinder while feeding dampening liquid and/or ink to the precursor. Optionally, after the imaging step, a heating step is carried out to enhance or to speed-up the polymerization and/or crosslinking reaction. The lithographic printing plate precursor can be prepared by (i) applying on a support the coating as described above and (ii) drying the precursor. Any coating method can be used for applying one or more coating solutions to the hydrophilic surface of the support. The multi-layer coating can be applied by coating/drying each layer consecutively or by the simultaneous coating of several coating solutions at once. In the drying step, the volatile solvents are removed from the coating until the coating is self-supporting and dry to the touch.

The printing plate thus obtained can be used for conventional, so-called wet offset printing, in which ink and an aqueous dampening liquid is supplied to the plate. Another suitable printing method uses a so-called single-fluid ink without a dampening liquid. Suitable single-fluid inks have been described in U.S. Pat. Nos. 4,045,232; 4,981,517 and 6,140,392. In a most preferred embodiment, the single-fluid ink comprises an ink phase, also called the hydrophobic or oleophilic phase, and a polyol phase as described in WO 00/32705.

EXAMPLES

Example 1

1. Preparation of the Printing Plate Precursors

Preparation of the Aluminium Support S-01

A 0.3 mm thick aluminium foil was degreased by spraying with an aqueous solution containing 26 g/l NaOH at 65° C. for 2 seconds and rinsed with demineralised water for 1.5 seconds. The foil was then electrochemically grained during 10 seconds using an alternating current in an aqueous solution containing 15 g/l HCl, 15 g/l SO42-ions and 5 g/l Al3+ ions at a temperature of 37° C. and a current density of about 100 A/dm2. Afterwards, the aluminium foil was then desmutted by etching with an aqueous solution containing 5.5 g/l of NaOH at 36° C. for 2 seconds and rinsed with demineralised water for 2 seconds. The foil was subsequently subjected to anodic oxidation during 15 seconds in an aqueous solution containing 145 g/l of sulfuric acid at a temperature of 50° C. and a current density of 17 A/dm2, then washed with demineralised water for 11 seconds and dried at 120° C. for 5 seconds.

The support thus obtained was characterized by a surface roughness Ra of 0.35-0.4 μm (measured with interferometer NT1100) and had an oxide weight of 3.0 g/m².

Preparation of Printing Plates PP-01 to PP-05

Photopolymerisable Layer

The printing plate precursors were produced by coating onto the above described support S-01 the components as defined in Table 1 dissolved in a mixture of 35% by volume of MEK and 65% by volume of Dowanol PM (1-methoxy-2-propanol, commercially available from DOW CHEMICAL Company). The coating solution was applied at a wet coating thickness of 30 μm and then dried at 120° C. for 1 minute in a circulation oven.

TABLE 1

| Composition of the photosensitive layer PL-0X | |
|---|---|
| Ingredients g/m² | PL-0X |
| FST 510 (1) | 0.250 |
| CN 104 (2) | 0.250 |
| Initiator-01 (3) | 0.045 |
| S2539 (4) | 0.020 |
| Ruco coat EC4811 (5) | 0.250 |
| Tegoglide 410 (6) | 0.0015 |
| Sipomer PAM 100 (7) | 0.130 |

TABLE 1-continued

| Composition of the photosensitive layer PL-0X | |
|---|---|
| Ingredients g/m² | PL-0X |
| HAP (8) | 0.020 |
| Aerosil R972 (9) | 0.085 |

(1) FST 510 is a reaction product from 1 mole of 2,2,4-trimethylhexamethylenediisocyanate and 2 moles of hydroxyethyl-methacrylate commercially available from AZ Electronics as a 82 wt. % solution in MEK;

(2) CN 104 is an epoxy acrylate oligomer commercially available from Arkema;

(3) Initiator-01 is bis(4-tert-butylphenyl)-iodonium tetraphenyl borate commercially available from Hampford Research Inc;

(4) S2539 is an infrared absorbing dye commercially available from FEW Chemicals

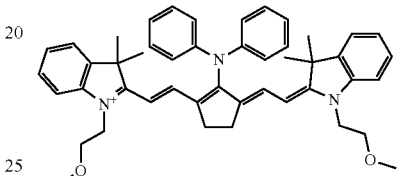

(5) Ruco coat EC4811 is a polyether polyurethane commercially available from Rudolf Chemistry (6) Tegoglide 410 is a surfactant commercially available from Evonik Tego Chemie GmbH;

(7) Sipomer PAM 100 is a methacrylate phosphonic ester commercially available from Rhodia;

(8) HAP is a hydrophilic substrate adhesive polymer according to Table 2;

(9) Aerosil R972 is a hydrophobic fumed silica commercially available from Evonik Resource Efficiency GmbH.

TABLE 2

| The hydrophilic substrate adhesive polymer (HAP) | | |
|---|---|---|
| Photolayer PL-0X | HAP-0X | |
| PL-01 | HAP-01 comparative | Albritect CP30 commercially available from Rhodia |
| PL-02 | HAP-02 inventive | Belclene 400 commercially available from BWA Water Additives |
| PL-03 | HAP-03 inventive | Belclene 499 commercially available from BWA Water Additives |
| PL-04 | HAP-04 comparative | Belclene 500 commercially available from BWA Water Additives |
| PL-05 | HAP-05 comparative | Aqualic AS58 commercially available from Nippon Shokubai |

On top of the photosensitive layer, a solution in water with the compositions as defined in Table 3 were coated (40 μm), and dried at 110° C. for 2 minutes. Printing plate precursors PPP-01 to PPP-05 were obtained (Table 4).

TABLE 3

| Composition of the protective overcoat layers OC-01 | |
|---|---|
| INGREDIENTS mg/m² | OC-01 |
| Mowiol 4-88 (1) | 200 |
| Diofan A050 (2) | 385 |
| Acticide LA1206 (3) | 1 |

TABLE 3-continued

Composition of the protective overcoat layers OC-01

| INGREDIENTS mg/m² | OC-01 |
|---|---|
| Lutensol A8 (4) | 6 |
| IR-01 (5) | 35 |

(1) Mowiol 4-88 is a partially hydrolyzed polyvinylalcohols commercially available from Kuraray;
(2) PVDC-1 is Diofan A050, PVDC-2 is Diofan A602, both polyvinylidenechloride latex commercially available from Solvay;
(3) IR-01 is a thermochromic infrared absorbing dye having the following formula:

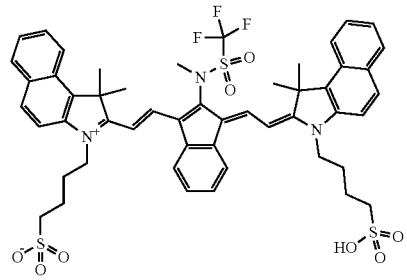 [SMILES: CN(C1=C(/C=C/C2=[N+](CCCCS(=O)(=O)O)c3ccc4ccccc4c3C2(C)C)c2ccccc2/C1=C\C=C1\N(CCCCS(=O)(=O)O)c2ccc3ccccc3c2C1(C)C)S(=O)(=O)C(F)(F)F]

(4) Lutensol A8TM is a surface active agent commercially available from BASF.

TABLE 4

Printing plate precursors PPP-01 to PPP-05

| Printing Plate Precursor | Photolayer | HAP-0X* |
|---|---|---|
| PPP-01 Comparative | PL-01 | HAP-01 |
| PPP-02 Comparative | PL-02 | HAP-02 |
| PPP-03 Inventive | PL-03 | HAP-03 |
| PPP-04 Inventive | PL-04 | HAP-04 |
| PPP-05 Comparative | PL-05 | HAP-05 |

*Hydrophilic substrate adhesive polymer; see Table 2 above.

Accelerated Ageing

The resulting printing plate precursors were subsequently subjected to an accelerated ageing test in a climate chamber for 3 days at 50° C. and 50% relative humidity.

Imaging

The printing plate precursors, both 'non-aged' and 'aged', were imaged at 2400 dpi with a High Power Creo 40W TE38 thermal Platesetter™ (200 lpi Agfa Balanced Screening (ABS)), commercially available from Kodak and equipped with a 830 nm IR laser diode, at an energy density of 130 mJ/cm².

Printing

After imaging, the printing plates were mounted on a Heidelberg GTO 52 Dalghren printing press. Each print job was started using K+E Skinnex 800 SPEED IK black ink (trademark of BASF Druckfarben GmbH) and 4 wt % Prima FS303 SF (trademark of Agfa Graphics) and 8% isopropanol in water as fountain solution. A compressible blanket was used and printing was performed on non-coated offset paper.

Prior to paper feeding, 10 press revolutions with only the dampening system engaged followed by 5 revolutions with only the inking rollers engaged was performed. Visual assessment of sheets 1-250 was performed to evaluate toning (i.e. accepting ink) in the non-image areas of the prints.

Results

The clean out results of the printing test in terms of toning behaviour are summarized in Table 5.

TABLE 5

Toning results

| PP-0X | HAP-0X | Toning[a] Non aged | Toning[a] aged |
|---|---|---|---|
| PP-01 comparative | HAP-01 | B | D |
| PP-02 inventive | HAP-02 | A | B |
| PP-03 inventive | HAP-03 | A | B |
| PP-04 comparative | HAP-04 | B | D |
| PP-05 comparative | HAP-05 | B | D |

[a]Toning is a rating for the amount of stain in the non-image areas on the printed sheets with
A: toning-free print before page 25,
B: a toning-free print between 25 and 50 sheets,
C: a toning-free print between 50 and 250 sheets, and
D: no toning-free print achieved up to 250 printed sheets.

The results in Table 5 show that the inventive printing plates including the hydrophilic adhesion promotor including the inventive copolymer (PP-02 and PP-03) show no toning for the non aged samples and slightly more toning for the aged samples. The comparative printing plates (PP-01, PP-04 and PP-05) show unacceptable toning after the aging test.

Example 2

Preparation of Printing Plates PP-06 to PP-08

Photopolymerizable Layer

The photopolymerizable layers PL-06 and PL-08 were produced by coating onto the above described support S-01 the components as defined in Table 6, dissolved in a mixture of 35% by volume of MEK and 65% by volume of Dowanol PM (1-methoxy-2-propanol, commercially available from DOW CHEMICAL Company). The coating solution was applied at a wet coating thickness of 30 μm and then dried at 120° C. for 1 minute in a circulation oven.

TABLE 6

Composition of photopolymerizable layers PL-0X

| INGREDIENTS (1) mg/m² | PL-06 | PL-07 | PL-08 |
|---|---|---|---|
| FST 510 | 250 | 250 | 250 |
| CN 104 | 250 | 250 | 250 |
| FP5041 | 30 | 30 | 30 |
| S2539 | 20 | 20 | 20 |
| Ruco coat EC4811 | 250 | 250 | 250 |
| Tegoglide 410 | 1.5 | 1.5 | 1.5 |
| JPA 528 (2) | 130 | 130 | 130 |
| HAP-02 | 15 | 10 | — |
| Aerosil R972 | 85 | 85 | 85 |

(1) See Table 1 above;
(2) JPA 528 is a polyethylene glycol monomethacrylate acid phosphate commercially available from Johoku Chemical Co., Ltd.

Protective Overcoat Layer

On top of the photosensitive layer, a solution in water with the composition as defined in Table 7 was coated (40 μm wet film), and dried at 110° C. for 2 minutes.

TABLE 7

Composition of the protective overcoat layers

| INGREDIENTS (1) mg/m² | OC-01 | OC-02 | OC-03 |
|---|---|---|---|
| Mowiol 4-88 | 200 | 200 | 200 |
| Diofan A050 | 385 | 385 | 385 |
| Acticide LA1206 | 1 | 1 | 1 |
| Lutensol A8 | 6 | 6 | 6 |
| IR-01 | 35 | 35 | 35 |
| HAP-02 | — | 10 | 40 |

(1) See Table 3 above.

Accelerated Ageing

The resulting printing plate precursors were subsequently subjected to an accelerated ageing test in a climate chamber for 3 days at 50° C. and 50% relative humidity.

Imaging

The printing plate precursors, both 'non-aged' and 'aged', were imaged at 2400 dpi with a High Power Creo 40W TE38 thermal Platesetter™ (200 lpi Agfa Balanced Screening (ABS)), commercially available from Kodak and equipped with a 830 nm IR laser diode, at an energy density of 130 mJ/cm².

Printing

After imaging, the printing plates were mounted on a Heidelberg GTO 52 Dalghren printing press. Each print job was started using K+E Skinnex 800 SPEED IK black ink (trademark of BASF Druckfarben GmbH) and 4 wt % Prima FS303 SF (trademark of Agfa Graphics) and 8% isopropanol in water as fountain solution. A compressible blanket was used and printing was performed on non-coated offset paper.

Prior to paper feeding, 10 press revolutions with only the dampening system engaged followed by 5 revolutions with only the inking rollers engaged was performed. Visual assessment of sheets 1-250 was performed to evaluate toning (i.e. accepting ink) in the non-image areas of the print.

Results

The clean out results of the printing test are summarized in Table 8. Printing was performed up to 40,000 impressions. The occurrence of toning on the printed sheets was evaluated every 25 printed sheets. The results of toning are summarized in Table 8.

TABLE 8

Toning behaviour

| | | HAP-02[a] mg/m² | Toning[b] | |
|---|---|---|---|---|
| Printing Plate | Photolayer | Protective overcoat layer | Non aged | Aged |
| PP-06 | 15 | — | A | A |
| PP-07 | 10 | 10 | A | B |
| PP-08 | — | 40 | A | A |

[a]See Table 2 above;
[b]Toning is a rating for the amount of ink acceptance in the non-image areas on the printed sheets with
A: toning-free print before page 25,
B: a toning-free print between 25 and 50 sheets,
C: a toning-free print between 50 and 250 sheets, and
D: no toning-free print achieved up to 250 printed sheets.
The results in Table 8 show that the inventive printing plates including the inventive copolymer (HAP 2) in either the photosensitive layer, the protective overcoat layer, or in both the photosensitive layer and the protective overcoat layer, achieve a fast toning free print. Printing was performed up to 40,000 impressions without noticeable wear.

The invention claimed is:

1. A lithographic printing plate precursor including, on a support, a coating comprising a photopolymerisable layer including a polymerisable compound, a photoinitiator, and an adhesion promoting compound,
   characterised in that the coating further comprises a hydrophilic substrate adhesive polymer including at least one monomeric unit according to Formula I, at least one monomeric unit according to Formula II, and at least one group and/or moiety including at least one phosphor atom;

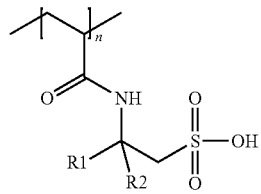

Formula I

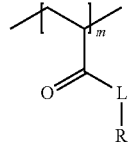

Formula II wherein
L represents O;
n and m independently represent an integer greater than 0;
R represents hydrogen; and
$R^1$ and $R^2$ each independently represent an optionally substituted linear, branched, or cyclic alkyl group, and
wherein the at least one group and/or moiety including at least one phosphor atom is at least one group of Formula V that is an endgroup of the backbone of the hydrophilic substrate adhesive polymer, at least one moiety of Formula VI that is randomly present in the backbone of the hydrophilic substrate adhesive polymer, or a combination thereof;

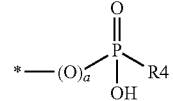

Formula V

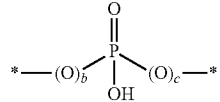

Formula VI wherein
a represents 0 or 1;
R4 represents -OH or a methyl group;
b and c independently represent 0 or 1; and
* denotes the linking position to the monomeric unit according to Formula I and/or Formula II.

2. The printing plate precursor of claim 1, wherein $R^1$ and $R^2$ each independently represent a methyl or ethyl group.

3. The printing plate precursor of claim 1, wherein the at least one group and/or moiety including at least one phosphor atom is at least one moiety of Formula VI that is randomly present in the backbone of the hydrophilic substrate adhesive polymer.

4. The printing plate precursor of claim 2, wherein the at least one group and/or moiety including at least one phosphor atom is at least one moiety of Formula VI that is randomly present in the backbone of the hydrophilic substrate adhesive polymer.

5. The printing plate precursor of claim 1, wherein the at least one group and/or moiety including at least one phosphor atom is at least one group of Formula V that is an endgroup of the backbone of the hydrophilic substrate adhesive polymer.

6. The printing plate precursor of claim 2, wherein the at least one group and/or moiety including at least one phosphor atom is at least one group of Formula V that is an endgroup of the backbone of the hydrophilic substrate adhesive polymer.

7. The printing plate precursor of claim 1, wherein the hydrophilic substrate adhesive polymer is a block-copolymer including alternating sequences of blocks consisting of monomeric units according to Formula I and monomeric units according to Formula II.

8. The printing plate precursor of claim 2, wherein the hydrophilic substrate adhesive polymer is a block-copolymer including alternating sequences of blocks consisting of monomeric units according to Formula I and monomeric units according to Formula II.

9. The printing plate precursor of claim 1, wherein the at least one monomeric unit according to Formula II and the at least one group and/or moiety including at least one phosphor atom are represented by Formula VII:

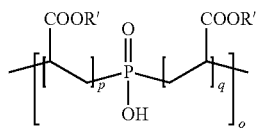

Formula VII wherein R' represents hydrogen;
o represents an integer between 1 and 100; and
p and q each independently represent an integer between 0 and 500.

10. The printing plate precursor of claim 1, wherein the hydrophilic substrate adhesive polymer further includes a monomeric unit derived from an acrylate, a methacrylate, styrene, an acrylamide, a methacrylamide, or a maleimide.

11. The printing plate precursor of claim 2, wherein the hydrophilic substrate adhesive polymer further includes a monomeric unit derived from an acrylate, a methacrylate, styrene, an acrylamide, a methacrylamide, or a maleimide.

12. The printing plate precursor of claim 1, wherein the hydrophilic substrate adhesive polymer is present in the coating in an amount of 5 to 100 mg/m$^2$.

13. The printing plate precursor of claim 2, wherein the hydrophilic substrate adhesive polymer is present in the coating in an amount of 5 to 100 mg/m$^2$.

14. The printing plate precursor of claim 1, wherein the hydrophilic substrate adhesive polymer has a weight average molecular weight below 100000.

15. The printing plate precursor of claim 1, wherein the coating comprises above the photopolymerisable layer a toplayer and the hydrophilic substrate adhesive polymer is present in the toplayer.

16. The printing plate precursor of claim 15, wherein the hydrophilic substrate adhesive polymer is present in both the photopolymerisable layer and the toplayer.

17. A method for making a printing plate precursor including the steps of
 a. coating on a support (i) a photopolymerisable layer including a polymerisable compound, a photoinitiator, and an adhesion promoting compound, and (ii) a substrate adhesive polymer as defined in claim 11, and
 b. drying the precursor.

18. A method for making a printing plate including the steps of
 a. image-wise exposing the printing plate precursor as defined in claim 1 to heat and/or IR radiation whereby a lithographic image consisting of image areas and non-image areas is formed,
 b. developing the exposed precursor.

19. The method of claim 18, wherein the precursor is developed by mounting the precursor on a plate cylinder of a lithographic printing press and rotating the plate cylinder while feeding dampening liquid and/or ink to the precursor.

* * * * *